(12) United States Patent
Hirata et al.

(10) Patent No.: US 8,063,812 B2
(45) Date of Patent: Nov. 22, 2011

(54) RADIO WAVE ABSORBER, ELECTROMAGNETIC FIELD MEASUREMENT SYSTEM AND RADIATED IMMUNITY SYSTEM

(75) Inventors: Masayuki Hirata, Kanagawa (JP); Hiroshi Andou, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 12/714,947

(22) Filed: Mar. 1, 2010

(65) Prior Publication Data
US 2010/0156696 A1    Jun. 24, 2010

Related U.S. Application Data

(62) Division of application No. 11/222,223, filed on Sep. 9, 2005, now Pat. No. 7,688,246.

(30) Foreign Application Priority Data

May 10, 2005  (JP) ................. P2005-137701
May 10, 2005  (JP) ................. P2005-137703
May 10, 2005  (JP) ................. P2005-137705

(51) Int. Cl.
*H01Q 17/00*  (2006.01)
*G01R 29/08*  (2006.01)
(52) U.S. Cl. ................. 342/4; 342/1; 342/165
(58) Field of Classification Search ............ 342/1–4
See application file for complete search history.

(56) References Cited

U.S. PATENT DOCUMENTS

| | | | |
|---|---|---|---|
| 2,293,839 A | 8/1942 | Linder | |
| 2,474,384 A | 6/1949 | Sunstein | |
| 3,290,598 A | 12/1966 | Thomas | |
| 3,315,259 A | 4/1967 | Ludwig | |
| 3,806,943 A | 4/1974 | Holloway | |
| 4,164,718 A | 8/1979 | Iwasaki | |
| 4,433,336 A * | 2/1984 | Carr | 343/728 |
| 4,700,190 A * | 10/1987 | Harrington | 342/2 |
| 4,864,315 A * | 9/1989 | Mohuchy | 343/703 |
| 4,901,080 A | 2/1990 | McHenry | |
| 4,931,798 A | 6/1990 | Kogo | |
| 4,968,983 A | 11/1990 | Maeda | |

(Continued)

FOREIGN PATENT DOCUMENTS

EP    1063528    12/2000

(Continued)

OTHER PUBLICATIONS

A. Frandsen et al., "Control of Scattering From Probes for Near-field Antenna Measurements by Use of Skirt," *Electronics Letters*, GB, vol. 40, No. 5, pp. 284-285, Mar. 4, 2004.

(Continued)

*Primary Examiner* — Thomas Tarcza
*Assistant Examiner* — Matthew M Barker
(74) *Attorney, Agent, or Firm* — Morgan, Lewis & Bockius LLP

(57) ABSTRACT

A radio wave absorber for use in an electromagnetic field probe that measures an electromagnetic field by means of an antenna section provided therewith, the radio wave absorber including: a first end section; a second end section that is located at a position opposite the first end section; and an intermediate section that is located between the first and second end sections, the intermediate section having outer dimension and thickness that increase in accordance with a distance from the first end section toward the second end section.

16 Claims, 21 Drawing Sheets

U.S. PATENT DOCUMENTS

| | | | |
|---|---|---|---|
| 5,028,928 | A | 7/1991 | Vidmar et al. |
| 5,113,190 | A | 5/1992 | Klein |
| 5,134,405 | A | 7/1992 | Ishihara et al. |
| 5,276,448 | A | 1/1994 | Naito et al. |
| 5,355,109 | A | 10/1994 | Yamazaki |
| 5,417,178 | A * | 5/1995 | Harrelson, II ................ 114/343 |
| 5,438,333 | A | 8/1995 | Perkins et al. |
| 5,525,988 | A | 6/1996 | Perkins et al. |
| 5,617,095 | A | 4/1997 | Kim et al. |
| 5,710,564 | A | 1/1998 | Numtz et al. |
| 5,844,518 | A | 12/1998 | Berg et al. |
| 5,910,787 | A | 6/1999 | Berg et al. |
| 5,936,568 | A | 8/1999 | Berg et al. |
| 5,977,854 | A | 11/1999 | Mihara et al. |
| 6,008,753 | A | 12/1999 | Berg et al. |
| 6,031,498 | A | 2/2000 | Issler |
| 6,373,425 | B1 | 4/2002 | Inoue et al. |
| 6,738,007 | B1 | 5/2004 | Stafford |
| 6,771,204 | B2 | 8/2004 | Hayashi et al. |
| 6,784,419 | B1 | 8/2004 | Hayashi et al. |
| 6,828,931 | B2 | 12/2004 | Kikuchi et al. |
| 6,914,571 | B1 | 7/2005 | Lemanczyk et al. |
| 6,943,286 | B1 | 9/2005 | Kurihara et al. |
| 7,102,562 | B2 | 9/2006 | Moller et al. |
| 7,136,008 | B2 * | 11/2006 | Aisenbrey .................... 342/4 |
| 7,190,301 | B2 | 3/2007 | Krenz et al. |
| 7,239,261 | B2 | 7/2007 | Fujieda et al. |
| 7,471,233 | B2 * | 12/2008 | Kurihara et al. .............. 342/4 |
| 2001/0053673 | A1 | 12/2001 | Toyoda et al. |
| 2002/0171503 | A1 | 11/2002 | Ohtani et al. |
| 2003/0047338 | A1 | 3/2003 | Okayama et al. |
| 2003/0107025 | A1 | 6/2003 | Okayama et al. |
| 2003/0146866 | A1 | 8/2003 | Hayashi et al. |
| 2004/0104836 | A1 | 6/2004 | Mukasa et al. |
| 2004/0239570 | A1 | 12/2004 | Aisenbrey |
| 2005/0008845 | A1 | 1/2005 | Hatanaka et al. |
| 2005/0147804 | A1 | 7/2005 | Harada et al. |
| 2005/0254759 | A1 * | 11/2005 | O'Brien ........................ 385/92 |
| 2006/0202882 | A1 | 9/2006 | Noda et al. |

FOREIGN PATENT DOCUMENTS

| | | |
|---|---|---|
| FR | 2623288 A1 | 5/1989 |
| JP | 4-29069 | 1/1992 |
| JP | 4-140671 | 5/1992 |
| JP | 6-242161 | 9/1994 |
| JP | 7-55863 | 3/1995 |
| JP | 7-167904 | 7/1995 |
| JP | 7-193388 | 7/1995 |
| JP | 9-292422 | 11/1997 |
| JP | 2001-133495 | 5/2001 |
| JP | 2001-165983 | 6/2001 |
| JP | 2001-255347 | 9/2001 |
| JP | 2003-037402 | 2/2003 |
| JP | 2003-86989 | 3/2003 |
| JP | 2004-161342 | 6/2004 |

OTHER PUBLICATIONS

Christos Kinezos et al., "A Low Cost Conversion of Semi-Anechoic Chamber to Fully-Anechoic Chamber for RF Antenna Measurements," *2003 IEEE International Symposium on Electromagnetic Compatibility*, NY, vol. 1 of 2, pp. 724-729, Aug. 18, 2003.

* cited by examiner

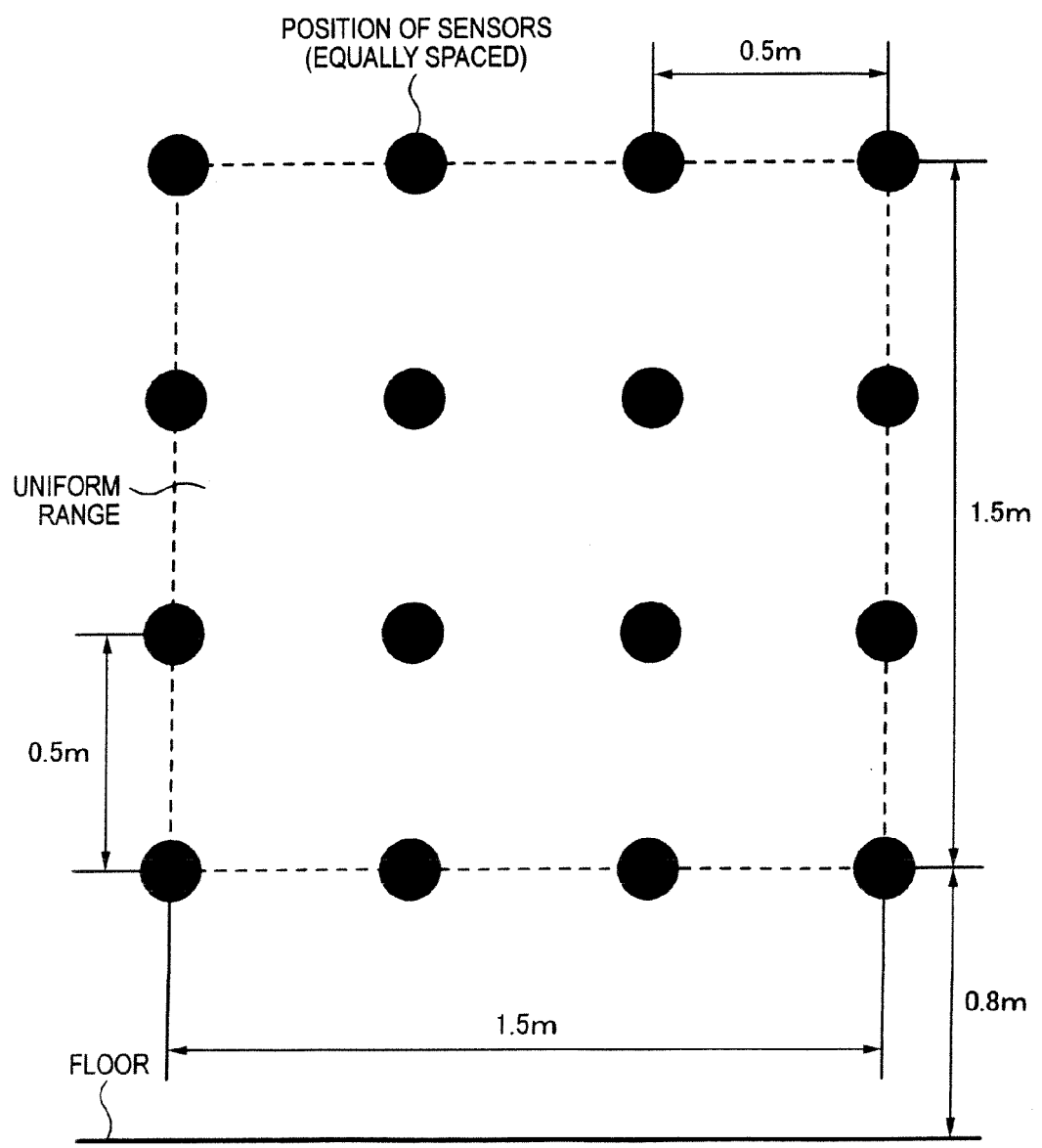

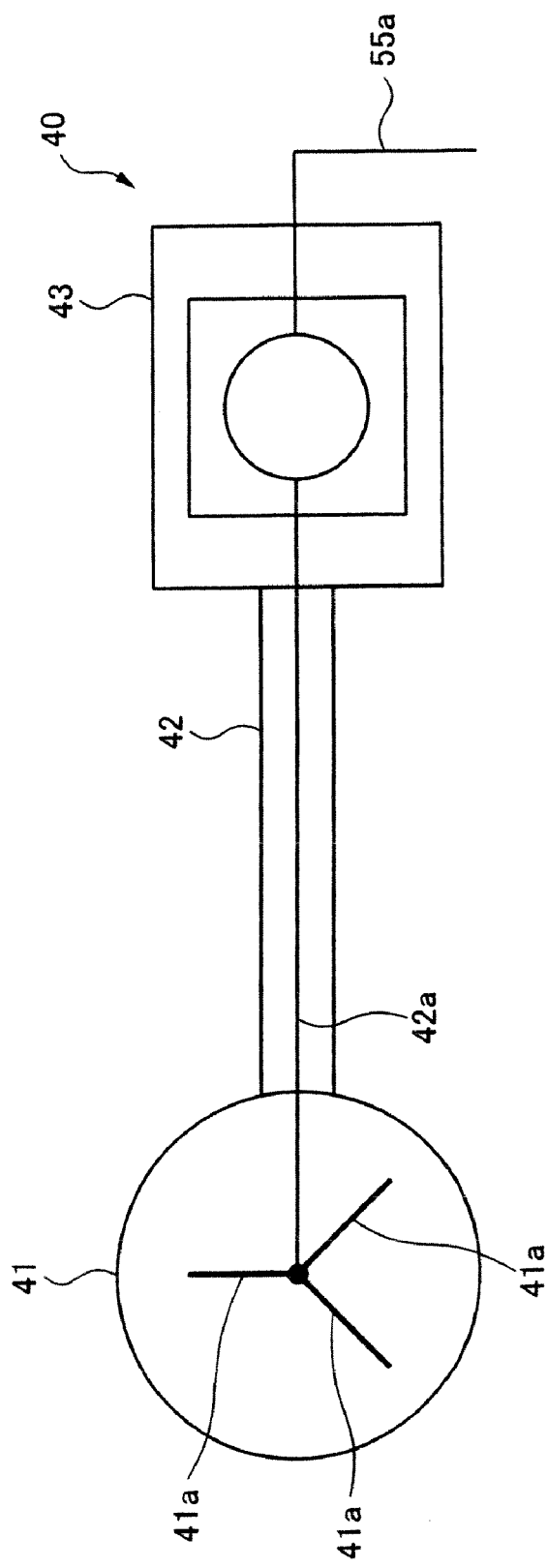

FIG. 16

| MOUNTING TYPE | (1) | (2) | (3) | (4) | (5) | (6) |
|---|---|---|---|---|---|---|
| RANGE OF VARIATIONS (dB) | 1.7 | 1.6 | 1.3 | 2.2 | 7.0 | 7.0 |

FIG. 20

| MOUNTING TYPE | (1) | (2) | (3) | (4) |
|---|---|---|---|---|
| RANGE OF VARIATIONS (dB) | 1.7 | 1.6 | 7.0 | 7.0 |

US 8,063,812 B2

RADIO WAVE ABSORBER, ELECTROMAGNETIC FIELD MEASUREMENT SYSTEM AND RADIATED IMMUNITY SYSTEM

This is a divisional of U.S. patent application Ser. No. 11/222,223, filed Sep. 9, 2005 now U.S. Pat. No. 7,688,246, which is hereby incorporated by reference.

BACKGROUND OF THE INVENTION

1. Field of the Invention

The present invention relates to an electromagnetic field measurement system for measuring an electromagnetic field by means of an electromagnetic field probe, and to a radiated immunity system.

The present invention also relates to an electromagnetic field probe used for measuring an electromagnetic field, and to a radio wave absorber and an exterior body that cover an electromagnetic field probe for measuring an electromagnetic field.

2. Description of the Related Art

Many electromagnetic wave sources, such as electronic equipment, electrical appliances, and radio equipment, have recently become prevalent in home. Electromagnetic waves originating from the electromagnetic wave sources have the potential risk of affecting the ambient electromagnetic-wave environment in various manners, and the electronic equipment, or the like, which becomes the source of electromagnetic waves may also be affected by the electromagnetic environment originating from another electromagnetic wave source. For these reasons, the electronic equipment is desired to prevent emission of electromagnetic waves outside the equipment and to have EMC (Electro-Magnetic Compatibility) measures of resistance to the ambient electromagnetic environment.

The EMC measures must be adopted so as to address emission or EMI (Electro-Magnetic Interface) and immunity or EMS (Electro-Magnetic Susceptibility).

IEC61000-4-3 is available as upstandards for evaluating immunity of such electronic equipment or the like. In order to evaluate resistance of electronic equipment to electromagnetic interference, a test defined by the regulations is conducted by exposing a device under test or EUT (Equipment under Test) to electromagnetic interference to which electronic equipment is presumed to be exposed, and observing the behavior of the device or EUT.

A specific configuration for an immunity test is described in JP-A-4-029069. The document JP-A-4-029069 describes the steps of: emitting electromagnetic wave noise toward a device under test placed in a radio wave shielded chamber whose wall surfaces are filled with radio absorbers; and a technician monitoring whether or not the device under test performs faulty operation when exposed to this disturbance factor, by way of a monitor. Evaluation of immunity of such electronic equipment to radiation noise entails prevention of influence of electromagnetic wave noise to the outside and highly accurate measurement of a characteristic.

In order to conduct an immunity test, formation of a uniform electric field region within the radio wave shielded chamber must have been ascertained in advance. Ascertaining the performance of such a radio wave shielded chamber requires measuring the value of electric field intensity in the radio wave shielded chamber through use of a field sensor; and recording the resultant deviation.

As to a field sensor, a product capable of measuring a broadband frequency exceeding 1 GHz is commercially available (e.g., a probe manufactured by ETSLINDGREN Co., Ltd.), and the value of field intensity in the radio wave shielded chamber is measured by use of the field sensor.

SUMMARY OF THE INVENTION

However, among other problems, when the frequency has exceeded 1 GHz, the commercially-available field sensor encounters a problem of increased frequency of occurrence of a measurement error. This problem is considered to be attributable to reflection of an electromagnetic wave due to the structure of the field sensor. In order to minimize such a phenomenon of reflection of an electromagnetic wave, there has already been proposed a method for effecting measurement by tilting the field sensor to a 45-degree angle or a 33.5-degree angle. However, this method has failed to prevent occurrence of the phenomenon of reflection of an electromagnetic wave over a wide broadband frequency spectrum.

The present invention has been made in view of the above circumstances and provides a radio wave absorber, an electromagnetic field measurement system, and a radiated immunity system.

According to a first aspect of the invention, there is provided a radio wave absorber used for in an electromagnetic field probe that measures an electromagnetic field by means of an antenna section provided therewith, the radio wave absorber including: a first end section; a second end section that is located at a position opposite the first end section; and an intermediate section that is located between the first and second end sections, the intermediate section having outer dimension and thickness that increase in accordance with a distance from the first end section toward the second end section.

According to a second aspect of the invention, there is provided an exterior body used in an electromagnetic field probe having a radio wave reflector extending from an antenna section to a box section, the exterior body including: a radio wave absorber; a housing section that is provided in the radio wave absorber and houses the radio wave reflector and the box section of the electromagnetic field probe; an antenna side edge section located at a portion of the radio wave absorber facing the antenna section of the electromagnetic field probe; and a box side edge section located at a portion of the radio wave absorber facing the box section of the electromagnetic field probe, wherein the exterior body has outer dimension and thickness that increases with an increase in distance from the antenna side edge section toward the box side edge section.

According to a third aspect of the invention, there is provided an exterior body used in an electromagnetic field probe having a radio wave reflector extending from an antenna section to a box section, the exterior body including: a first exterior section that forms a part of the exterior body; and a second exterior section that forms a part of the exterior body and engages with the first exterior section in a splitable manner; wherein each of the first and second exterior sections has: a radio wave absorber that covers the radio wave reflector of the electromagnetic field probe; and a radio wave transmission body that is provided on an exterior surface of the radio wave absorber, wherein the radio wave absorber includes an antenna side edge section located at a portion of the radio wave absorber facing the antenna section of the electromagnetic field probe; and a box side edge section located at a portion of the radio wave absorber facing the box section of the electromagnetic field probe, wherein the exterior body has outer dimension and thickness that increases with an increase in distance from the antenna side edge section toward the box side edge section.

According to a fourth aspect of the invention, there is provided an electromagnetic field probe including: an antenna section; a radio wave reflector extending from the antenna section; and a radio wave absorber that surrounds a circumference of the radio wave reflector and is provided with a portion having outer dimension and thickness that increase in accordance with a distance from the antenna section.

According to a fifth aspect of the invention, there is provided an electromagnetic field probe including: an antenna section that measures an electromagnetic field; a wire connected to the antenna section; a shielding member that shields the wire; a box section that receives an input of a measurement result of the antenna section by way of the wire; and a radio wave absorber that surrounds circumferences of the shielding member and the box section, wherein the radio wave absorber is provided with a portion having outer dimension and thickness that increase in accordance with a distance from the antenna section.

According to a sixth aspect of the invention, there is provided an electromagnetic field measurement system including: an electromagnetic field probe having an antenna section that measures an electromagnetic field, and a radio wave reflector extending from the antenna section; a radio wave absorber that is mounted to the radio wave reflector of the electromagnetic field probe and has a portion having outer dimension and thickness increase in accordance with an increase in a distance from the antenna section of the electromagnetic field probe; and a probe retaining member that retains the electromagnetic field probe.

According to a seventh aspect of the invention, there is provided a radiated immunity system for measuring uniformity of an electromagnetic field required for a radiated immunity test, the radiated immunity system including: a radiation antenna; an antenna section that measures an electromagnetic field by means of the radiation antenna; a wire connected to the antenna section a shielding member that shields the wire; and a radio wave absorber that surrounds a circumference of the shielding member, the radio wave absorber having outer dimension and thickness that increase in accordance with a distance from the antenna section.

According to an eighth aspect of the invention, there is provided a radio wave absorber for use in an electromagnetic field probe that measures an electromagnetic field by means of an antenna section provided therewith, the radio wave absorber including: a proximal end section that is provided close to the antenna section; and a distal end section that is located at a position opposite the proximal end section and remote from the antenna section, wherein a cross-sectional area of the radio wave absorber increases in accordance with a distance from the proximal end section toward the distal end section, and wherein the cross-sectional area is configured to be maximum at an intermediate section between the proximal end section and the distal end section or at the position of the distal end section.

According to a ninth aspect of the invention, there is provided an exterior body used in an electromagnetic field probe having a radio wave reflector extending from an antenna section to a box section, the exterior body including: a radio wave absorber; a housing section that is provided in the radio wave absorber and houses the radio wave reflector and the box section of the electromagnetic field probe; an antenna side edge section located at a portion of the radio wave absorber facing the antenna section of the electromagnetic field probe; and a box side edge section located at a portion of the radio wave absorber facing the box section of the electromagnetic field probe, wherein a cross-sectional area of the radio wave absorber increases in accordance with a distance from the antenna side edge section toward the box side edge section, and wherein the cross-sectional area is configured to be maximum at an intermediate section between the antenna side edge section and the box side edge section or at the position of the box side edge section.

According to a tenth aspect of the invention, there is provided an exterior body used in an electromagnetic field probe having a radio wave reflector extending from an antenna section to a box section, the exterior body including: a first exterior section that forms a part of the exterior body; and a second exterior section that forms a part of the exterior body and engages with the first exterior section in a splitable manner; wherein each of the first and second exterior sections has: a radio wave absorber that covers the radio wave reflector of the electromagnetic field probe; and a radio wave transmission body that is provided on an exterior surface of the radio wave absorber, wherein the radio wave absorber has a proximal end section provided close to the antenna section of the electromagnetic field probe and a distal end section provided remote from the antenna section, wherein the radio wave absorber has a cross-sectional area that increases in accordance with a distance from the proximal end section toward the distal end section, and wherein the cross-sectional area is configured to be maximum at an intermediate section between the proximal end section and the distal end section or at the position of the distal end section.

According to an eleventh aspect of the invention, there is provided an electromagnetic field probe including: an antenna section; a wire connected to the antenna section; a support member that supports the antenna section; and a longitudinal radio wave absorber surrounding a circumference of the support member, wherein the radio wave absorber has a proximal end section provided close to the antenna section and a distal end section provided remote from the antenna section, wherein a cross-sectional area of the radio wave absorber increases in accordance with a distance from the proximal end section toward the distal end section, and wherein the cross-sectional area is configured to be maximum at an intermediate position between the proximal end section and the distal end section or at the position of the distal end section.

According to a twelfth aspect of the invention, there is provided an electromagnetic field probe including: an antenna section that measures an electromagnetic field; a wire connected to the antenna section; a shielding member that shields the wire; a box section that receives an input of a measurement result of the antenna section by way of the wire; and a radio wave absorber that surrounds circumferences of the shielding member and the box section, wherein the radio wave absorber has a proximal end section provided close to the antenna section and a distal end section provided remote from the antenna section, wherein a cross-sectional area of the radio wave absorber increases in accordance with a distance from the proximal end section toward the distal end section, and wherein the cross-sectional area is configured to be maximum at an intermediate position between the proximal end section and the distal end section or at the position of the distal end section.

According to a thirteenth aspect of the invention, there is provided an electromagnetic field measurement system including: an electromagnetic field probe having an antenna section that measures an electromagnetic field, a retaining member that retains the antenna section, and a box section that receives an input of result of measurement performed by the antenna section; a radio wave absorber that surrounds a circumference of the retaining member of the electromagnetic field probe and a circumference of the box section; and a cable that extends from the box section of the electromagnetic field probe, wherein the radio wave absorber has a proximal end section provided close to the antenna section of the electromagnetic field probe and a distal end section provided remote from the antenna section, wherein a cross-sectional area of the radio wave absorber increases in accordance with a distance from the proximal end section toward the distal end section; and wherein the cross-sectional area is configured to be maximum at an intermediate position between the proximal end section and the distal end section or at the position of the distal end section.

According to a fourteenth aspect of the invention, there is provided a radiated immunity system for measuring uniformity of an electromagnetic field required for a radiated immunity test, the radiated immunity system including: a radiation antenna; an antenna section that measures an electromagnetic field by means of the radiation antenna; a wire connected to the antenna section; a shielding member that shields the wire; and a radio wave absorber that surrounds a circumference of the shielding member, wherein the radio wave absorber has a proximal end section provided close to the antenna section of the electromagnetic field probe and a distal end section provided remote from the antenna section, wherein a cross-sectional area of the radio wave absorber increases in accordance with a distance from the proximal end section toward the distal end section; and wherein the cross-sectional area is configured to be maximum at an intermediate position between the proximal end section and the distal end section or at the position of the distal end section.

BRIEF DESCRIPTION OF THE DRAWINGS

In the accompanying drawings:

FIG. 3 is a descriptive view for describing calibration points in a uniform electromagnetic field range;

FIG. 4 is a schematic block diagram of a probe main body;

FIG. 16 is a graph showing variations computed from the test results;

FIG. 20 is a graph showing variations computed from the test results; and

DETAILED DESCRIPTION OF THE EMBODIMENT

An embodiment of the invention will be described with reference to the drawings.

Figure 1:
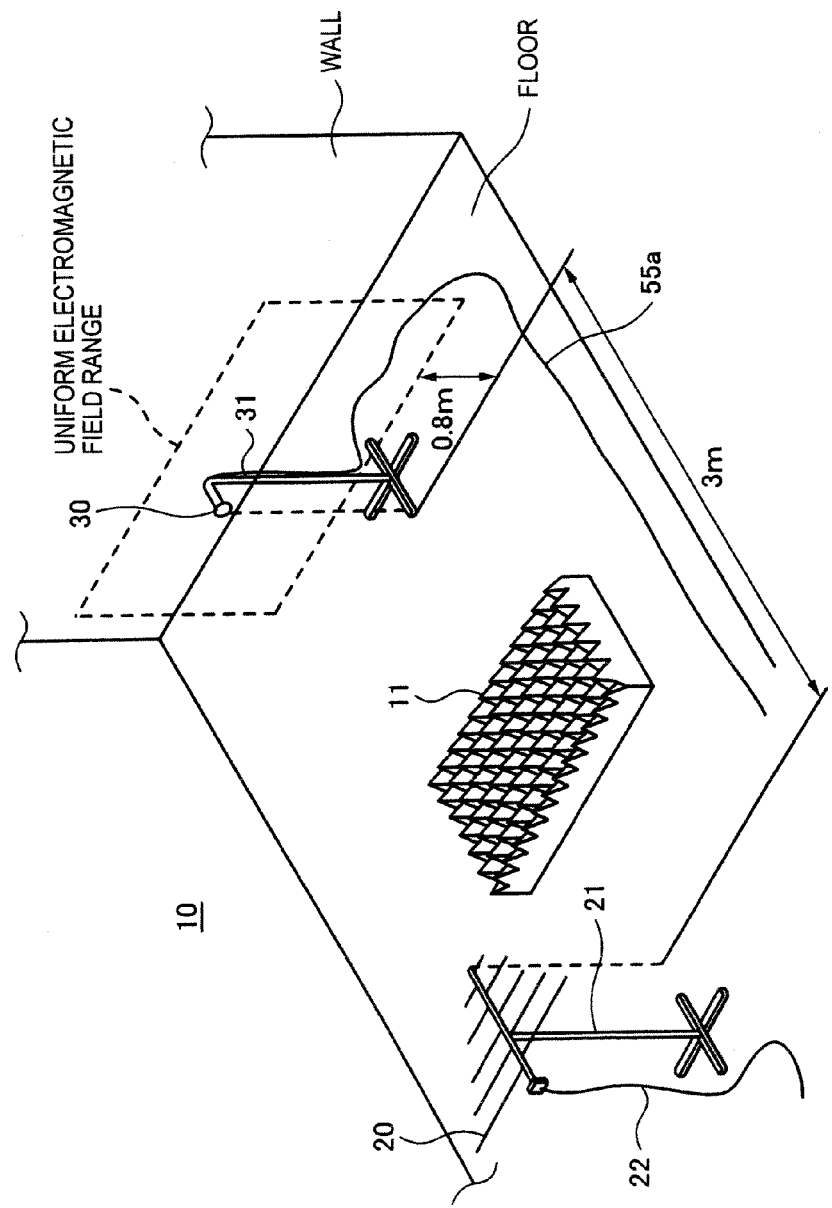
FIG. 1 is a schematic block diagram showing a radiation field immunity system according to an embodiment of the present invention.

FIG. 1 is a schematic block diagram showing a radiation field immunity system according to an embodiment. An electromagnetic field immunity system shown in FIG. 1 shows a structure for calibrating the electric field uniformity of radiation field immunity test.

As shown in FIG. 1, the radiation field immunity system has a radio wave shielded chamber 10. The radio wave shielded chamber 10 is for creating a desired electromagnetic environment isolated from the outside. Namely, the radio wave shielded chamber 10 prevents entrance of a radio wave from the outside, as well as preventing leakage of radio wave noise emitted from an antenna 20 to the outside, which will be described later and is set in the radio wave shielded chamber 10. Unillustrated radio wave absorbers for absorbing electromagnetic waves are provided on the walls and ceiling of the radio wave shielded chamber 10. An additional radio wave absorber 11 is placed in a predetermined area of the floor for setting, in the radio wave shielded chamber 10, an electromagnetic wave damping characteristic required for a quasi-anechoic chamber. Specifically, the additional radio wave absorber 11 is placed at a position on the floor between the antenna 20 and a probe 30. A uniform electromagnetic field area (Uniform Area), which will be described later, is set in the radio wave shielded chamber 10.

The antenna (electromagnetic field generation means) 20 and the probe (a field sensor or electric field sensor) 30 are provided in the radio wave shielded chamber 10. This antenna 20 is for generating an electromagnetic field in the radio wave shielded chamber 10 and is attached to an upstand 21. The probe 30 includes a probe main body 40 (see FIG. 4) and radio wave absorbers attached to the probe main body 40. The probe main body 40 is an isotropic electromagnetic field probe and corresponds to a dedicated measurement instrument designed for measuring an electromagnetic environment. The probe 30 is for measuring an intensity value (electric field intensity) of the electromagnetic field developed in the antenna 20, and is attached to an upstand 31 so as to assume a predetermined positional relationship with respect to the antenna 20.

Figure 2:
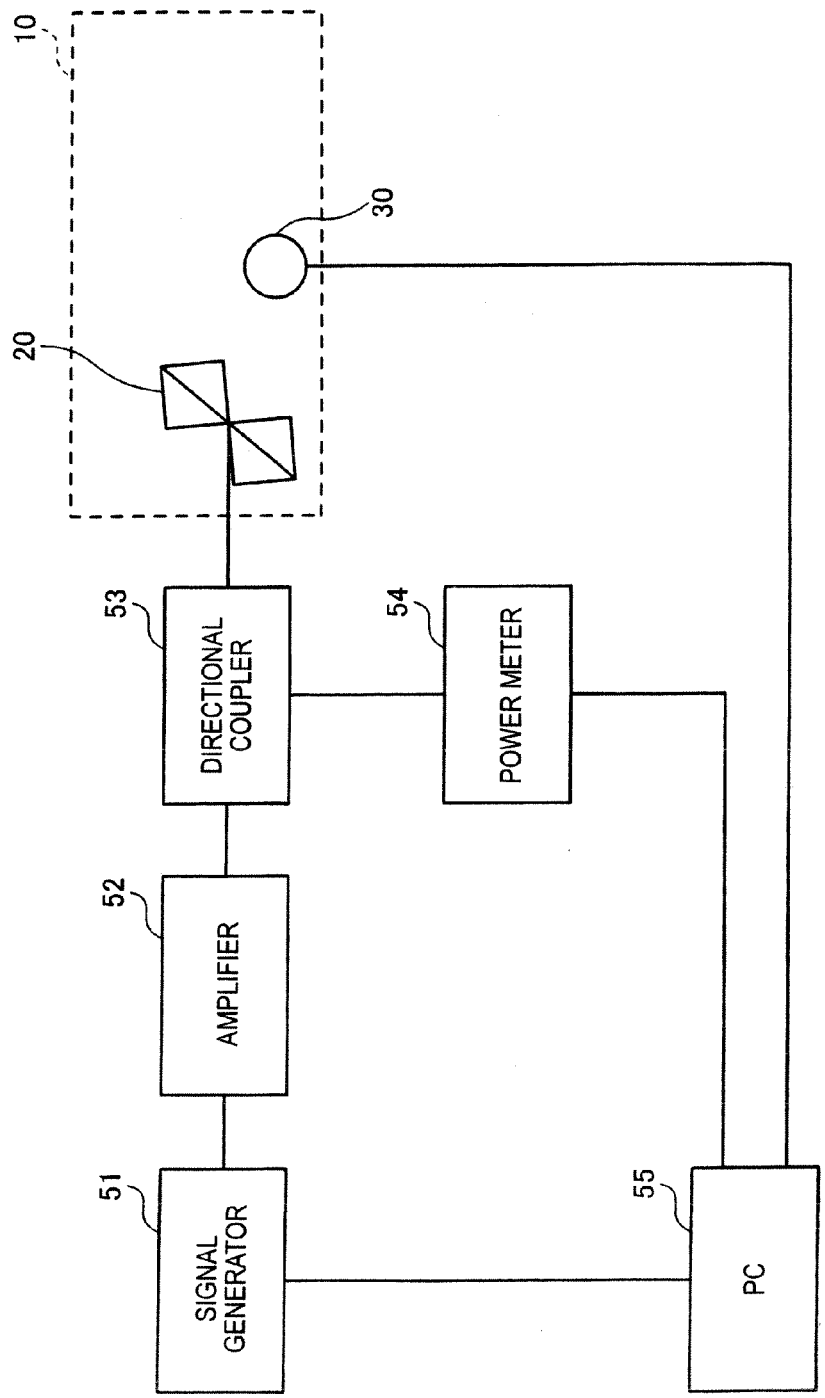
FIG. 2 is a block diagram showing the configuration of the radiation field immunity system.

FIG. 2 is a block diagram showing the configuration of a radiation field immunity system.

As shown in FIG. 2, the radiated immunity system includes a signal generator 51; an amplifier 52; a directional coupler 53; a power meter (measurement instrument) 54; and a PC (personal computer) 55. The signal generator 51 is a device for generating a modulated voltage waveform determined by specifications. The amplifier 52 is a device which amplifies an output from the signal generator 51 to thus acquire power required to emit a sufficient electromagnetic field. The directional coupler 53 is a device which is connected to the antenna 20 by means of a cable 22 and is used for routing an RF (Radio Frequency) signal and a microwave signal, both of which are to be used for isolating, separating, or connecting a signal. The power meter 54 is a device for measuring the intensity (power) of a high-frequency signal with high accuracy. The PC 55 is connected to the signal generator 51, the power meter 54, and the probe 30. Specifically, the signal generator 51 and the amplifier 52 are controlled by the PC 55 by way of an unillustrated bus. Moreover, the PC 55 is connected to the probe 30 by means of exchanging signals by way of an optical fiber 55a (see FIG. 1).

As mentioned above, as compared with electrical transmission, use of the transmission system formed from the optical fiber 55a enables noise-resistant, faster, and longer-distance transmission.

FIG. 3 is a descriptive view for describing calibration points within the uniform electromagnetic field range shown in FIG. 1.

As shown in FIG. 1, the uniform electromagnetic field range shown in FIG. 3 is a vertical plane which is spaced 3 meters away from the antenna 20 and measures 1.5 meters by 1.5 meters. A total of 16 calibration points are set at uniform intervals of 0.5 meters within the uniform electromagnetic field area. Such a uniform electromagnetic field area is set at a height of 0.8 meters from the floor. Electric field intensity values of the respective calibration points are measured through use of the probe 30. After the mean value has been computed by the PC 55 on the basis of the data pertaining to the measured sixteen calibration points, a deviation is computed by subtracting the mean value from the respective sets of data. Thus, the performance of the radio wave shielded chamber 10 is ascertained.

FIG. 4 is a schematic block diagram of the probe main body 40.

As shown in FIG. 4, the probe main body 40 includes a head section (antenna section) 41, a pipe section (a radio wave reflector, a retaining member, and shielding member) 42, and a box section 43. The pipe section 42 extends from the box section 43, and the head section 41 is attached to the extremity of the pipe section 42. Put another way, the head section 41 is provided at one end of the pipe section 42, and the box section 43 is disposed at the other end of the pipe section 42.

The head section 41 is spherical, and a small receiving antenna (an isotropic antenna) 41a is provided in the head section 41. The pipe section 42 is formed from a steel pipe member for shielding purpose, and a cable (line material) 42a is inserted in the steel pipe member so as to extend in the axial direction thereof. The box section 43 is made of metal and is formed in a shape of a box. The box section 43 houses an unillustrated circuit board, which is used for performing arithmetic operation through use of the result received by the head section 41 and effects E/O conversion, and an unillustrated rechargeable battery. An optical signal output from the unillustrated circuit board, or the like, is transmitted to the PC 55 (see FIG. 2) disposed outside the radio wave shielded chamber 10 by way of the optical cable 55a.

In the probe main body 40 shown in FIG. 4, the cable 42a connected to the antenna 41a is shielded by the pipe section 42. However, in a case where the cable 42a itself has a shielding function, various modifications are conceivable.

For instance, in a conceivable configuration, an unillustrated non-metallic member, such as resin, is provided for retaining the head section 41 in lieu of the pipe section 42 made from a steel pipe. In that case, the cable 42a can be routed over an exterior surface of the unillustrated non-metallic member.

In another configuration, for example, the head section 41 is retained by polystyrene foam to be described later (see FIGS. 13A-14B). In that case, there can be realized a simple configuration, wherein solely the cable 42a is arranged in a radio wave absorber (see reference numeral 110 in FIGS. 5A and 5B) to be described later.

Shapes, or the like, of various types of radio wave absorbers attached to the probe main body 40 will now be described by reference to FIGS. 5A to 12B. FIGS. 5 to 12 are block diagrams showing a status in which a radio wave absorber is attached to the probe main body 40. FIGS. 5A, 6A, 7A, 8A, 9A, 10A, 11A, and 12A are front views showing a two-piece radio wave absorber with one of the pieces being removed, and FIGS. 5B, 6B, 7B, 8B, 9B, 10B, 11B, and 12B are left-side views showing the two-piece radio wave absorber with both pieces attached together.

The radio wave absorber to be described below has an elongated internal space which corresponds to the shape of the attached probe main body 40. The radio wave absorber to be described below is formed to have a uniform concentration of carbon.

Figure 5A:
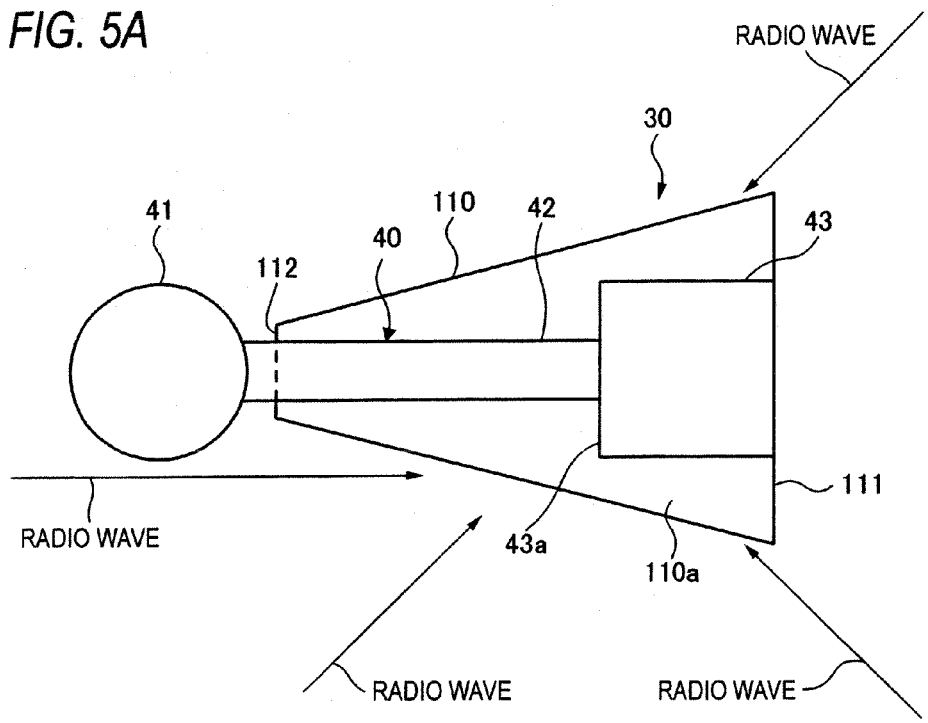
FIGS. 5A and 5B are block diagrams showing that a radio wave absorber is attached to the probe main body.
Figure 5B:
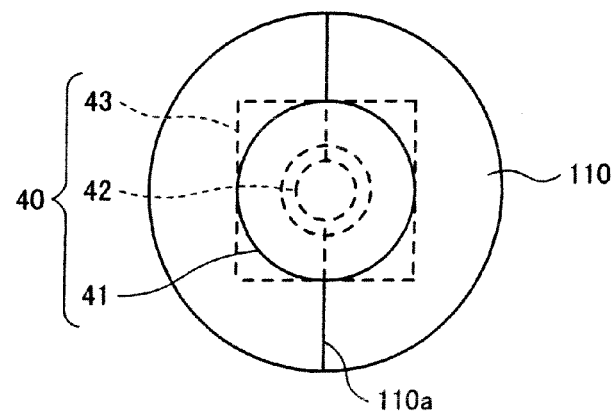

A radio wave absorber 110 shown in FIGS. 5A and 5B is formed in a shape of a truncated cone, wherein a cone is cut by a plane substantially parallel to a lower bottom surface (a distal end, and a box side edge section) 111 to thus form an upper bottom surface (a proximal end, and an antenna side edge section) 112. Specifically, a tapered shape (pyramid shape) having a given tilt angle is formed over the entirety of the radio wave absorber 110. The outer shape of the radio wave absorber 110 is such that the outer shape and thickness of the radio wave absorber become larger as a distance from the head section 41 of the probe main body 40 increases in the axial direction of the pipe section 42. From another viewpoint, the radio wave absorber 110 assumes the outer shape such that the cross-sectional area of the upper bottom surface 112 is smaller than that of the lower bottom surface 111. From yet another viewpoint, the outer shape of the radio wave absorber 110 is such that the cross-sectional area becomes larger as a distance from the upper bottom surface 112 increases toward the lower bottom surface 111 and such that the cross-sectional area becomes maximum at the position of the lower bottom surface 111.

When the radio wave absorber 110 having such a tapered shape is viewed from the head section 41 of the probe main body 40, the thickness of the radio wave absorber 110 (along the axis of the pipe section 42) changes when the position changes along the radial direction of the radio wave absorber 110. Therefore, even in the case of the radio wave absorber 110 having a uniform concentration of carbon, the concentration of carbon changes in the radial direction of the radio wave absorber 110. As the distance to the pipe section 42 of the probe main body 40 becomes smaller, the carbon concentration increases. Conversely, when the distance to the pipe section 42 becomes greater, the carbon concentration decreases. Therefore, a broadband radio wave from the antenna 20 (see FIG. 1) can be absorbed, and occurrence of resonance in a broadband frequency spectrum can be suppressed. As a result of suppression of occurrence of resonance in such a broadband frequency spectrum, transformation of data, which would otherwise arise in spite of the probe 30 being placed in the same position or which would otherwise arise according to a probe 30 employed, can be prevented, to thus enhance reproducibility of the probe.

The radio wave absorber 110 covers the pipe section and the box section 43 of the probe main body 40. Therefore, resonance of the pipe section 42 can be suppressed by the radio wave absorber 110, and reflection of a radio wave, which would otherwise be caused by the box section 43, can be suppressed by the radio wave absorber 110.

The upper bottom surface 112 is situated at a position close to the head section 41 of the probe main body 40, and the lower bottom surface 111 is situated at a position close to the box section 43 of the probe main body 40. The upper bottom surface 112 is smaller in cross-sectional area than the lower bottom area 111. In addition, the upper bottom surface 112 is smaller than the outer diameter of the head section 41 of the probe main body 40. Therefore, the radio wave reflected from the radio wave absorber 110 can be prevented from causing interference with the head section 41.

The radio wave absorber 110 has a structure such that the absorber is split into two pieces along a mating face or a split face 110a. The radio wave absorber 110 is formed from two members (a first radio wave absorber portion and a second radio wave absorber portion). As a result of the radio wave absorber 110 having a split structure, ease of maintenance of the unillustrated rechargeable battery, or the like, housed in the box section 43 of the probe main body 40 can be enhanced as mentioned previously. The number of pieces into which the radio wave absorber 110 are to be separated may be any number other than two.

Figure 6A:
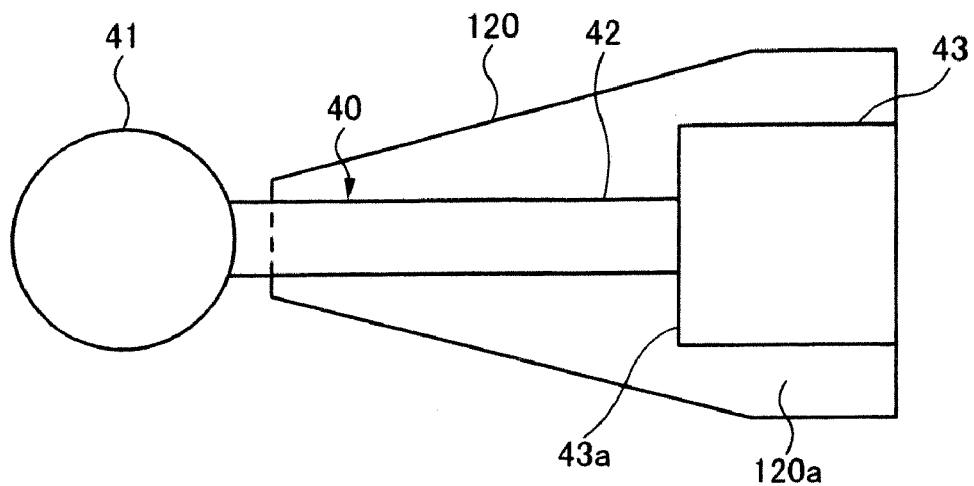
FIGS. 6A and 6B are block diagrams showing that a radio wave absorber is attached to the probe main body.
Figure 6B:
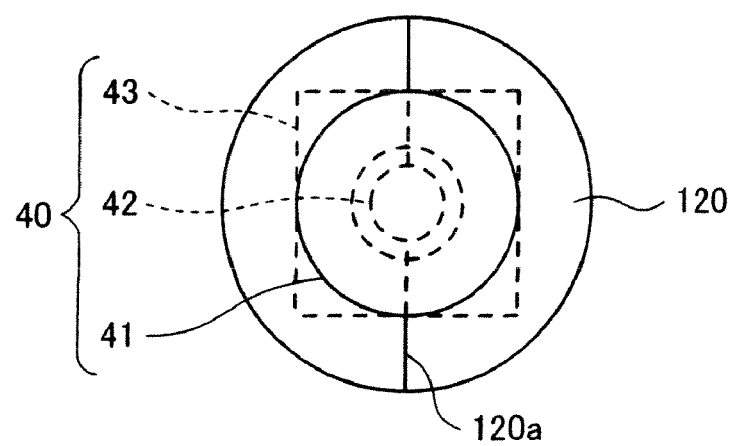

A radio wave absorber 120 shown in FIGS. 6A and 6B is formed in a shape made by combining together a truncated cone and a cylinder located on the lower bottom surface of the truncated cone. Specifically, the box section 43 of the probe main body 40 in the radio wave absorber 120 does not assume any tapered shape. The radio wave absorber 120 covers the pipe section 42 and the box section 43 of the probe main body 40. The radio wave absorber 120 has a structure such that the absorber is split into two pieces by a split face 120a.

Figure 7A:
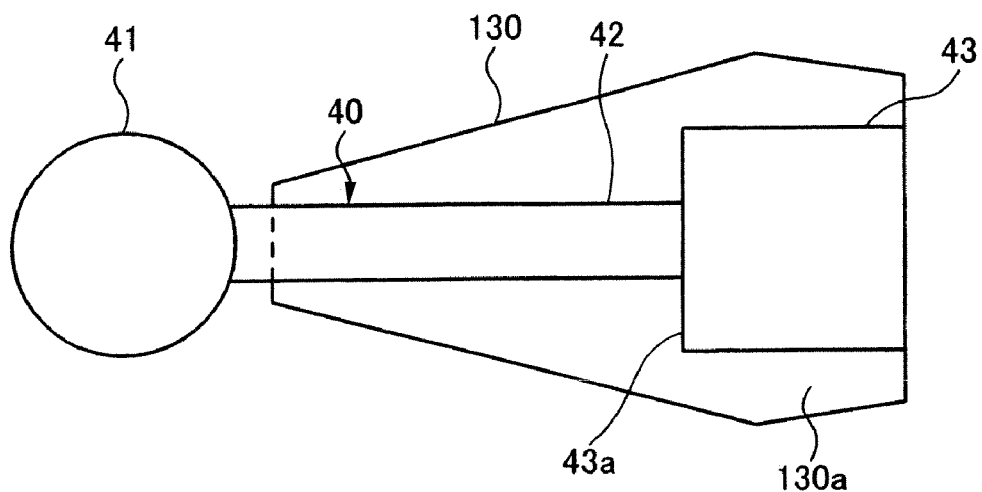
FIGS. 7A and 7B are block diagrams showing that a radio wave absorber is attached to the probe main body.
Figure 7B:
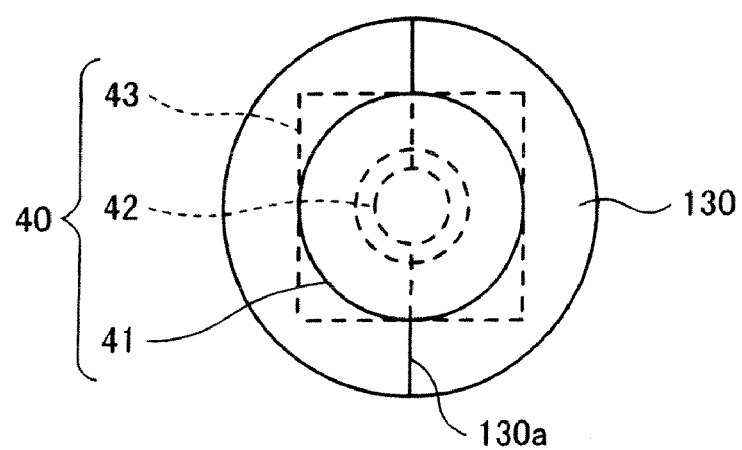

A radio wave absorber 130 shown in FIGS. 7A and 7B is formed in a shape made by combining together two truncated cones having different heights; in other words, a shape made by joining lower bottom surfaces of two truncated cones. Specifically, the radio wave absorber 130 assumes a reversely-tapered shape, wherein the inclination is inverted at some intermediate point on the tapered surface. The radio wave absorber 130 covers a pipe section 42 and a box section 43 of a probe main body 40. The radio wave absorber 130 has a structure such that the absorber is split into two pieces along a split face 130a.

Figure 8A:
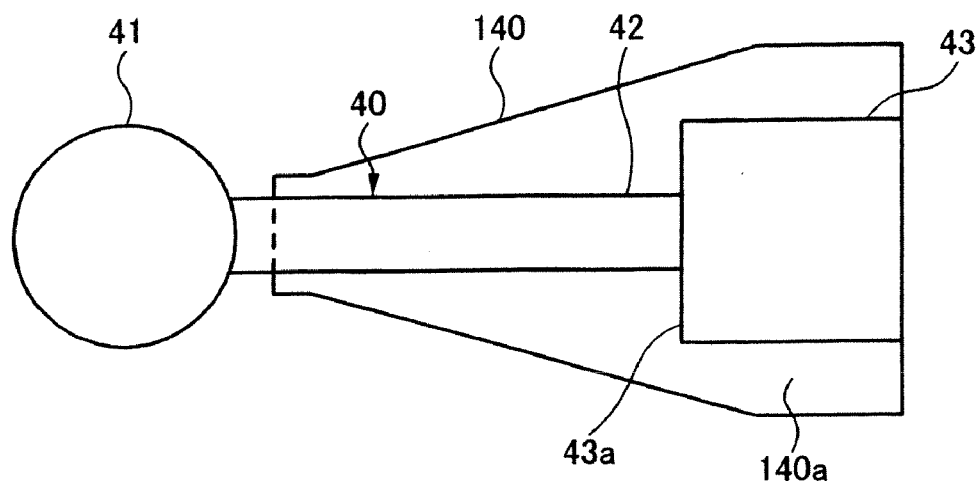
FIGS. 8A and 8B are block diagrams showing that a radio wave absorber is attached to the probe main body.
Figure 8B:
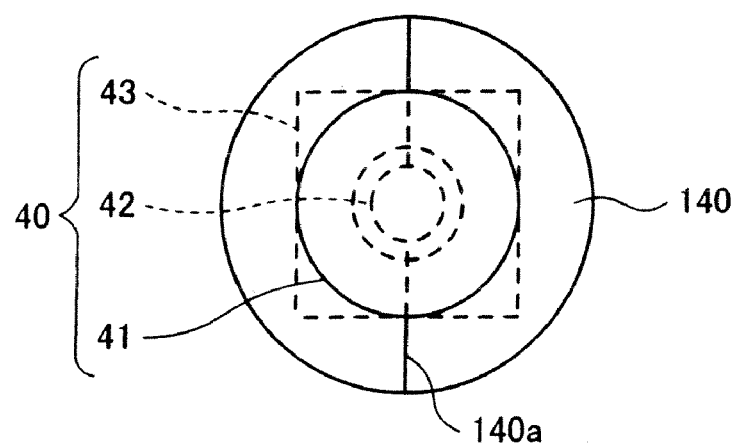

A radio wave absorber 140 shown in FIGS. 8A and 8B is formed in a shape formed by combining together a truncated cone, a cylinder located on the lower surface of the truncated cone, and a cylinder (flange section) situated on the upper bottom surface of the truncated cone. Specifically, the head section 41 and the box section 43 of the probe main body 40 in the radio wave absorber 140 do not assume any tapered shapes. Moreover, the radio wave absorber 140 covers the pipe section 42 and the box section 43 of the probe main body 40. The radio wave absorber 140 has a structure such that the absorber is split into two pieces along a split face 140a.

Figure 9A:
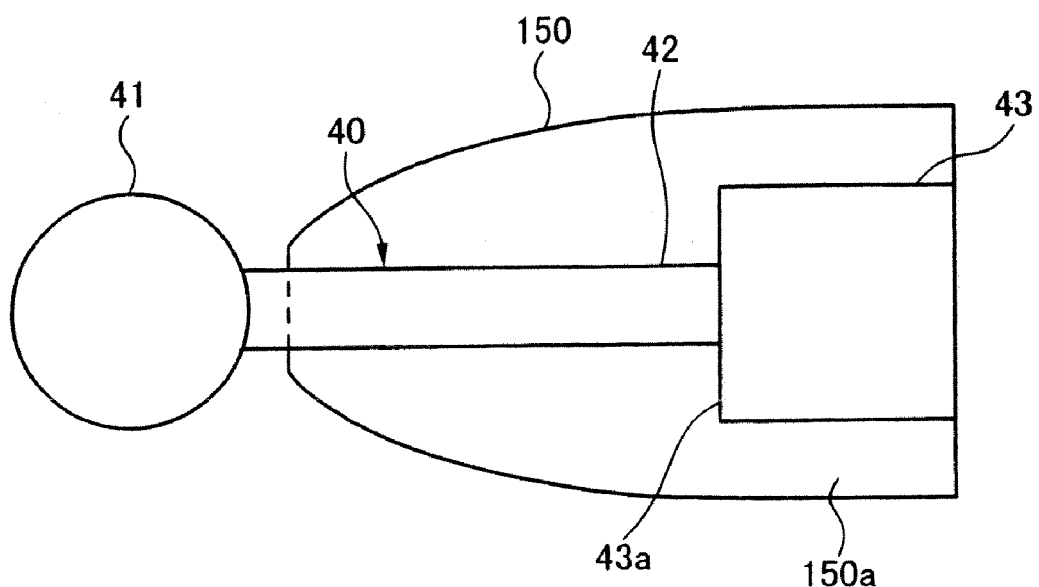
FIGS. 9A and 9B are block diagrams showing that a radio wave absorber is attached to the probe main body.
Figure 9B:
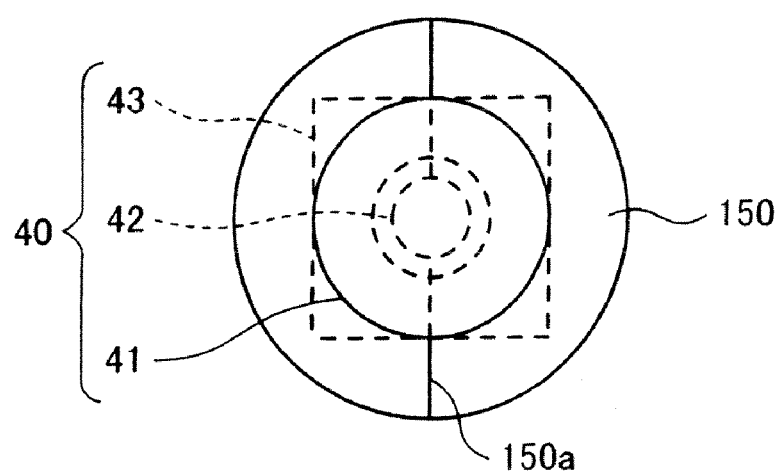

A radio wave absorber 150 shown in FIGS. 9A and 9B is formed in a shape of a so-called rugby ball or an substantially-bellshaped form, which is one-half of a substantially oval shape cut at some point on the major axis. Put another way, the radio wave absorber 150 is formed with an outer shape made by bulging a side surface of an substantially truncated cone; namely, the inclination angle of the tapered shape of the radio wave absorber 150 is not constant. The radio wave absorber 150 covers the pipe section 42 and the box section 43 of the probe main body 40. The radio wave absorber 150 has a structure such that the absorber is split into two pieces along a split face 150a.

Figure 10A:
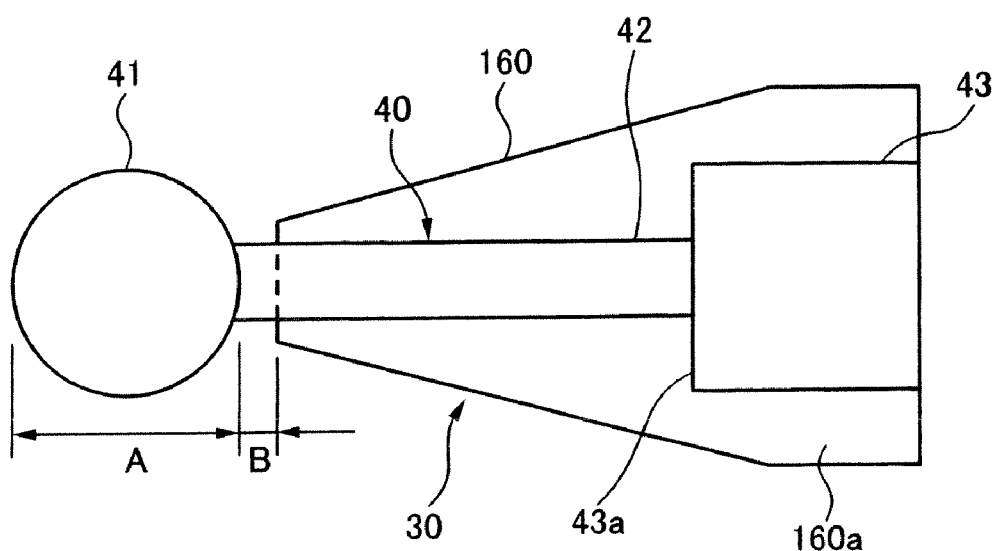
FIGS. 10A and 10B are block diagrams showing that a radio wave absorber is attached to the probe main body.
Figure 10B:
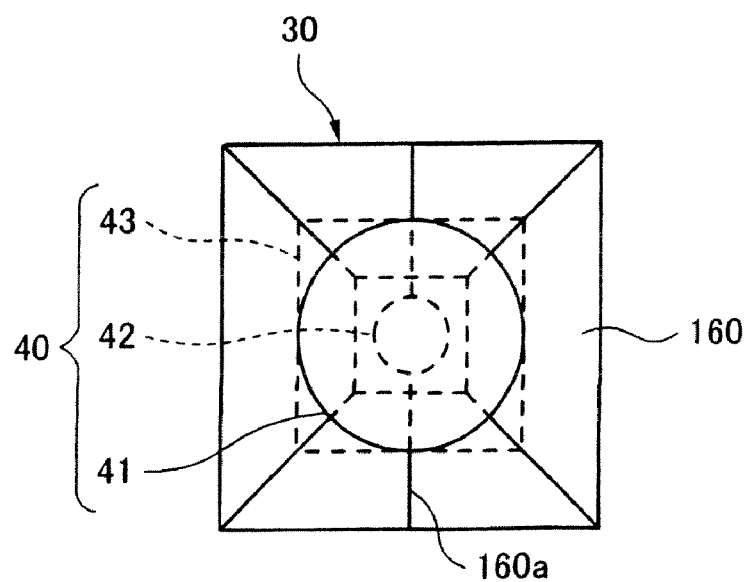

A radio wave absorber 160 shown in FIGS. 10A and 10B is formed in a shape made by combining together a truncated pyramid, and a square pole located on the lower bottom surface of the truncated pyramid. Specifically, the box section 43 of the probe main body 40 in the radio wave absorber 160 does not assume any tapered shape. The radio wave absorber 160 covers the pipe section 42 and the box section 43 of the probe main body 40. The radio wave absorber 160 assumes a structure such that the absorber is split into two pieces along a split face 160a. Although the shape of a truncated pyramid is illustrated in FIGS. 10A and 10B, adoption of a prismoid, such as a delta cone or a pentagonal cone, is also conceivable.

Figure 11A:
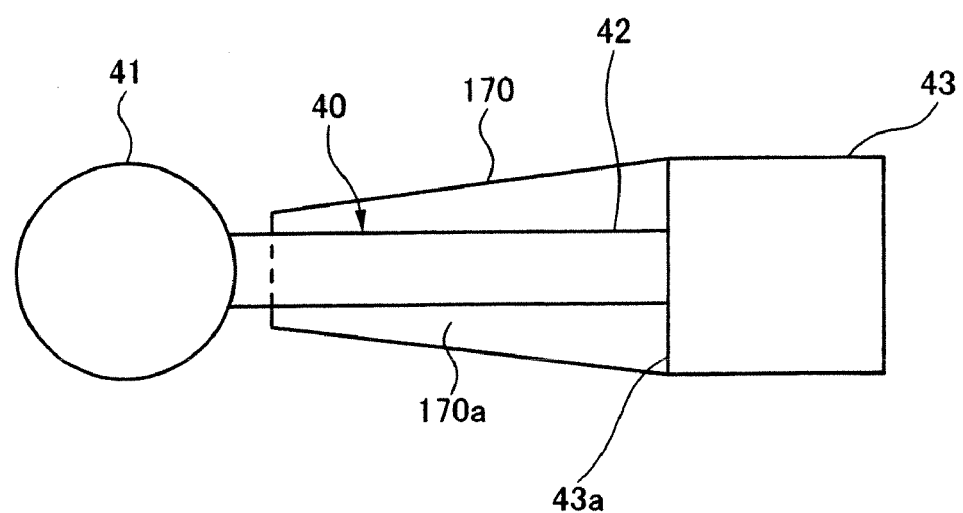
FIGS. 11A and 11B are block diagrams showing that a radio wave absorber is attached to the probe main body.
Figure 11B:
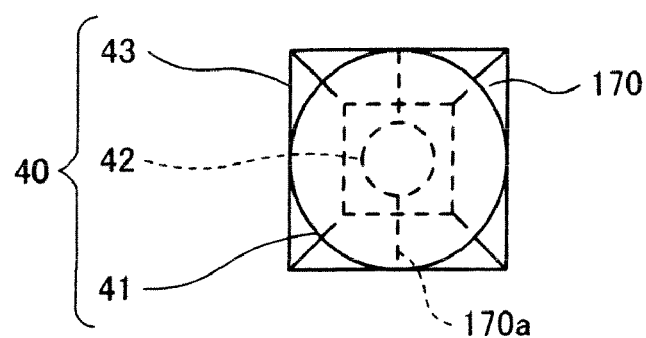

A radio wave absorber 170 shown in FIGS. 11A and 11B is formed in a shape of a truncated pyramid, and covers the pipe section 42 and a front surface 43a of the box section 43, both of which belong to the probe main body 40. The front surface 43a corresponds to a surface of the box section 43 facing the head section 41. As mentioned above, according to the embodiment shown in FIGS. 11A and 11B, the radio wave absorber 170 covers only the front surface 43a of the box section 43. Moreover, the radio wave absorber 170 has a structure such that the absorber is split into two pieces along a split face 170a.

Figure 12A:
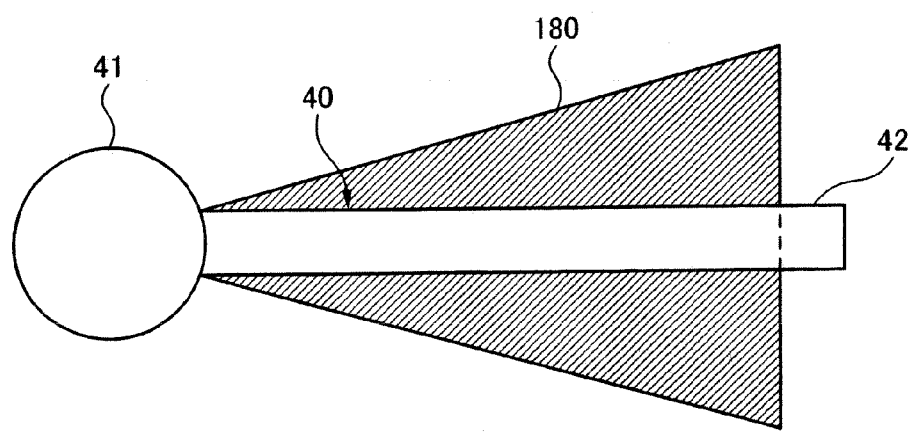
FIGS. 12A and 12B are block diagrams showing that a radio wave absorber is attached to the probe main body.
Figure 12B:
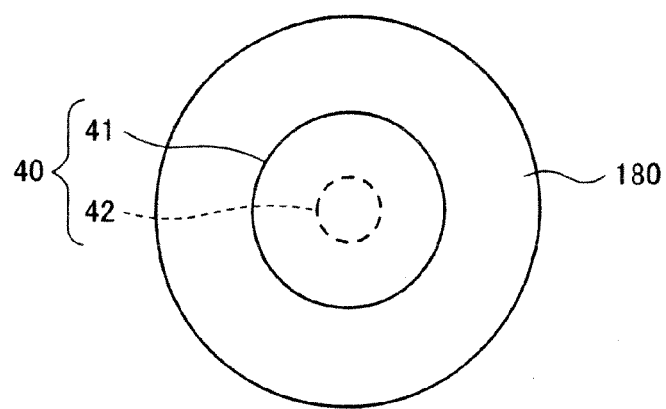

A radio wave absorber 180 shown in FIGS. 12A and 12B is formed in a shape of a truncated cone. Here, the probe main body 40 shown in FIGS. 12A and 12B is of a type which does not have the box section 43. Specifically, the probe main body 40 has the head section 41 and the pipe section 42, but does not have the box section 43. Therefore, the radio wave absorber 180 only covers the pipe section 42. One end of the radio wave absorber 180 is in contact with the head section 41.

Figure 13A:
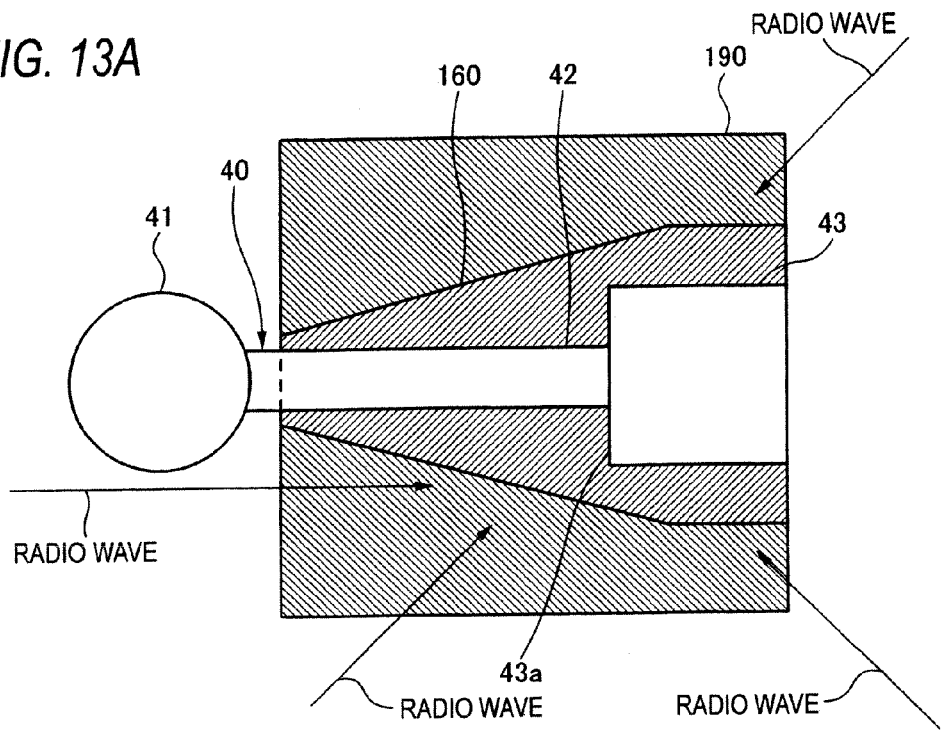
FIGS. 13A and 13B are block diagrams showing that a radio wave absorber and polystyrene foam are attached to the probe main body.
Figure 13B:
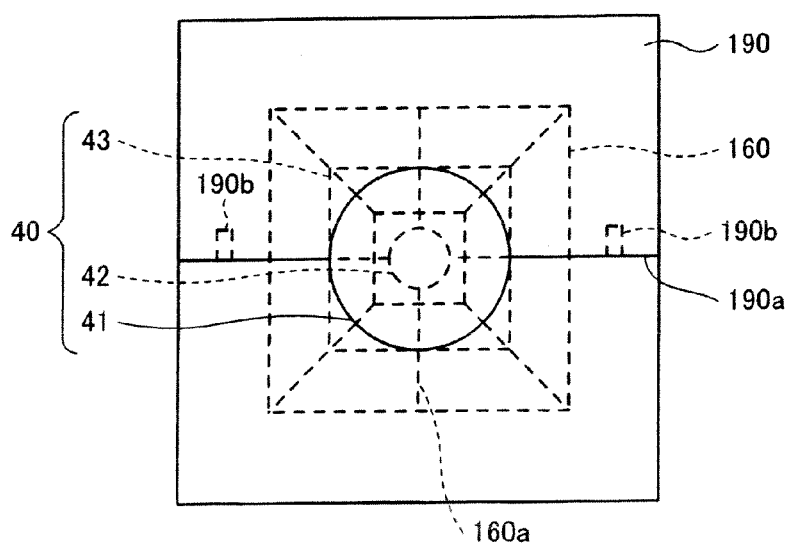
Figure 14A:
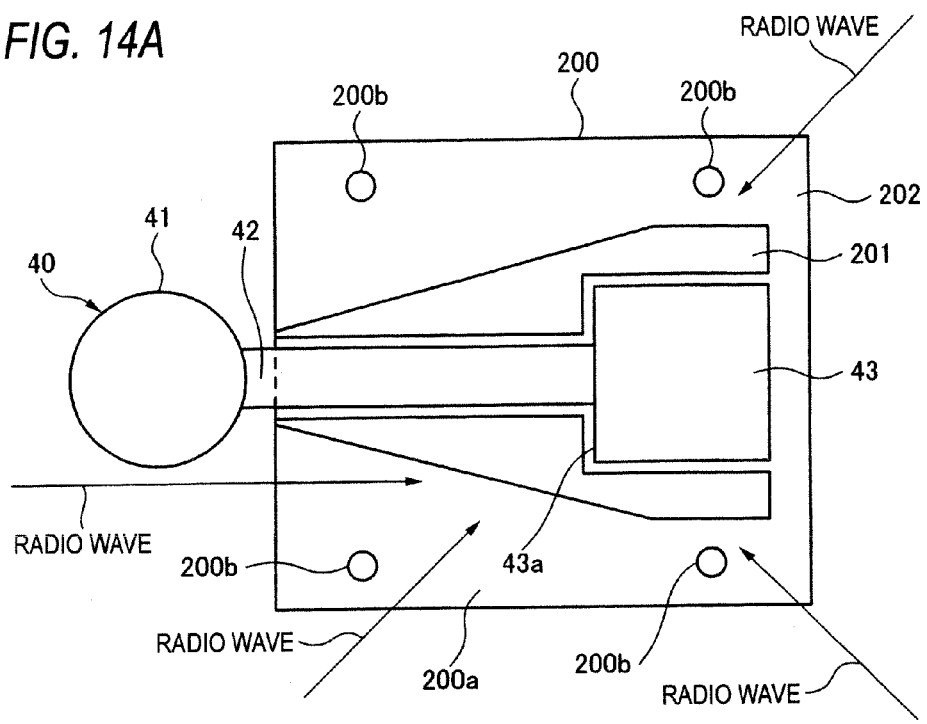
FIGS. 14A and 14B are block diagrams showing that a radio wave absorber and polystyrene foam are attached to the probe main body.
Figure 14B:
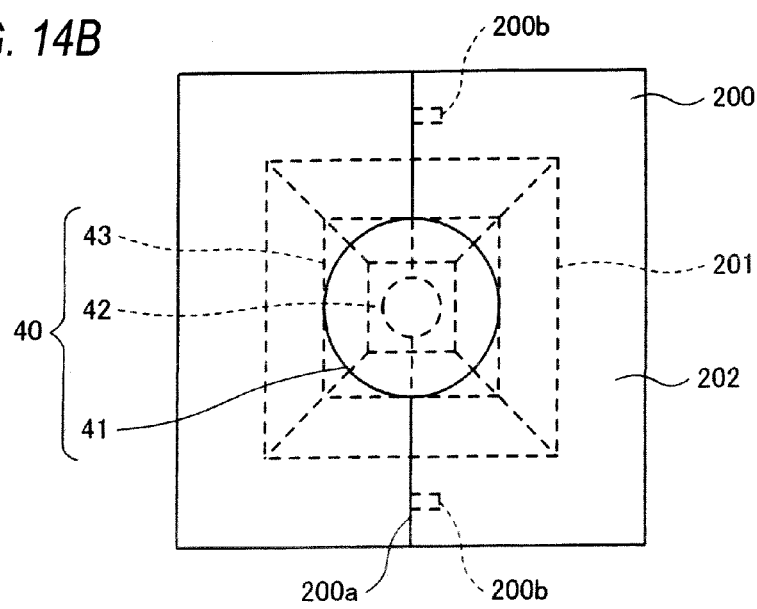

By reference to FIGS. 13A to 14B, there will now be described a case where a radio wave absorber and polystyrene foam are attached to the probe main body 40. FIGS. 13A to 14B are block diagrams showing a state where a radio wave absorber and polystyrene foam are attached to the probe main body 40. FIG. 13A is a longitudinal cross-sectional view, and FIG. 13B is a left elevation view. FIG. 14A is a front view showing that one of a two-split exterior body 200 (a radio wave absorber 201 and polystyrene foam 202) is removed, and FIG. 14B is a left elevation view showing that the two pieces of the two-split exterior body 200 are attached together.

In the case shown in FIGS. 13A and 13B, the radio wave absorber 160 shown in FIGS. 10A and 10B is covered with polystyrene foam (a posture defining member, a retaining section, a radio wave transmission body, and a maintaining member) 190. As shown in FIG. 13B, the polystyrene foam 190 has a structure such that the polystyrene foam is split into two pieces along a split face 190a. More specifically, the polystyrene foam 190 is formed from a first section (a first retaining section) and a second section (a second retaining section). This split face 190a extends in a direction substantially orthogonal to the split face 160a of the radio wave absorber 160. As mentioned above, in the case shown in FIGS. 13A and 13B, there is adopted a configuration such that the two-split radio wave absorber 160 is sandwiched between the pieces of the polystyrene foam 190.

As shown in FIG. 13B, the polystyrene foam 190 is provided with latch sections 190b. More specifically, a boss-shaped section is formed in one of the two pieces of the two-split polystyrene foam 190, and a mating section which mates with the boss-shaped section is formed on the other piece. Therefore, two pieces of the two-split polystyrene foam 190 can be coupled together with reliability.

In the case shown in FIGS. 13A and 13B, after the probe main body 40 has been covered with the radio wave absorber 160, the radio wave absorber 160 can be sandwiched between the pieces of the polystyrene foam 190, whereby the probe main body 40 can be assembled. By means of such an assembly, the polystyrene foam 190 comes into contact with an exterior surface of the radio wave absorber 160, so that the posture of the radio wave absorber 160 can be held in a horizontal position.

The majority of mass of the polystyrene foam 190 is occupied by air. For this reason, even when the radio wave absorber 160 is enfolded with the polystyrene foam 190, no problems arise in the state of a radio wave. It is preferable to use polystyrene foam of a high expansion ratio as the polystyrene foam 190.

In the case shown in FIGS. 14A and 14B, the radio wave absorber 201 and the polystyrene foam 202 are formed into one piece, to thus constitute the exterior body 200. Therefore, the number of parts handled by an operator can be diminished, and operability can be enhanced.

In this exterior body 200, the polystyrene foam 202 runs along the entire perimeter of the radio wave absorber 201. More specifically, the polystyrene foam (structure body) 202 is interposed between the probe main body 40 and the radio wave absorber 201. By means of such a configuration, even when the radio wave absorber 201 is formed from an easily-deformable material, the load attributable to the weight of the probe main body 40 can be imposed on the polystyrene foam 202, so that deformation of the radio wave absorber 201 can be prevented. Therefore, an intended advantage attributable to the shape of the radio wave absorber 201; that is, an advantage of a broadband radio wave absorber, or the like, can be yielded sufficiently.

The exterior body 200 has a structure such that the exterior body is split into two pieces along a split face 200a. Specifically, the exterior body 200 is formed from a first exterior section and a second exterior section. The exterior body 200 is provided with a latch section 200b. Therefore, the two pieces of the exterior body 200 can be coupled without fail.

The exterior body 200—into which the radio wave absorber 201 and the polystyrene foam 202 are formed integrally—is considered to be formed into a configuration where the polystyrene foam 202 is not interposed between the probe main body 40 and the radio wave absorber 201.

Here, the radiation field immunity system has been described thus far as the embodiment of the present invention. However, the present invention can also be considered to be formed as a system which evaluates emission (EMI). This emission system is for evaluating whether or not the conductivity of a radiation field emitted from a device under test, such as an electronic device, and intensity of radioactive interference exceed predetermined limit values.

The emission system is for measuring noise emitted from the device under test. As in the case of immunity, measurement of noise is usually performed within the radio wave shielded chamber 10 (see FIG. 1). The structure of the emission system employed for that case negates the need for the antenna 20, the upstand 21, the cable 22, and an additional radio wave absorber 11 (see FIG. 1) to be placed on the floor. An unillustrated device under test is placed in a position where the antenna 20 is to be set. By means of such a configuration, the field intensity developing from a position spaced a given distance from the device under test is measured by the probe 30 (see FIG. 1).

EXAMPLES

Examples of the present invention will now be described.

In the examples, the probe 30 is set at an elevation equivalent to the elevation of the antenna 20. Tests were conducted while conditions, such as attachment of the probe 30 and the shape of a radio wave absorber of the probe 30, were varied. The amplifier 52 was controlled while frequency sweep from 4000 MHz (4 GHz) to 6000 MHz (6 GHz) was being performed such that the field intensity measured by the probe 30 assumes a value of 10 V/m, whereby power of the amplifier 52 was measured. Specifically, the power required to maintain field intensity to 10 V/m was measured. A radio wave absorber of so-called high carbon type formed by impregnating urethane with 3 to 5 mg/liter of carbon was used as a radio wave absorber. The concentration of carbon in the radio wave absorber is constant.

Figure 15A:
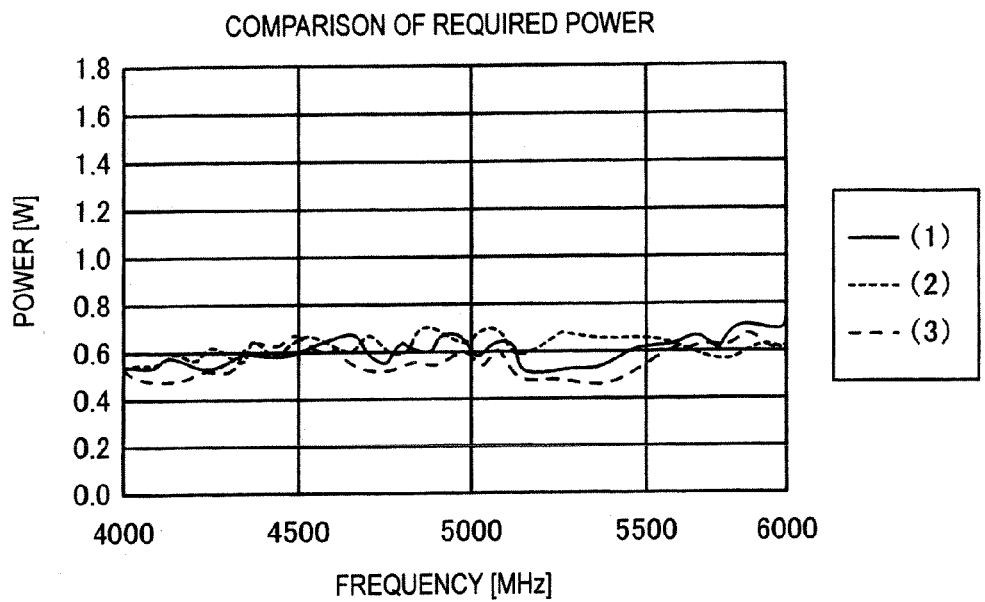
FIGS. 15A and 15B are graphs showing results of examples.
Figure 15B:
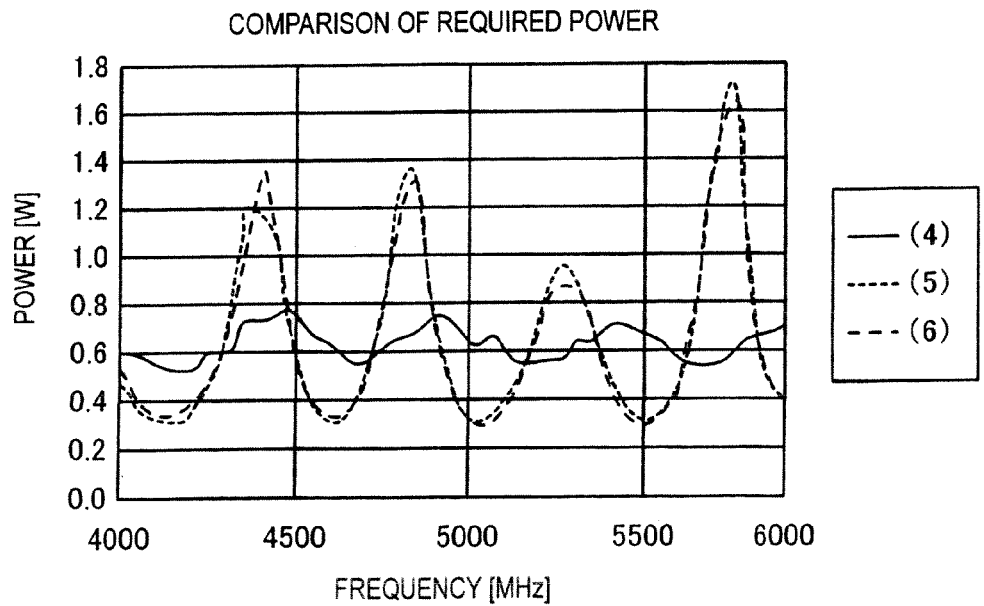
Figure 17:
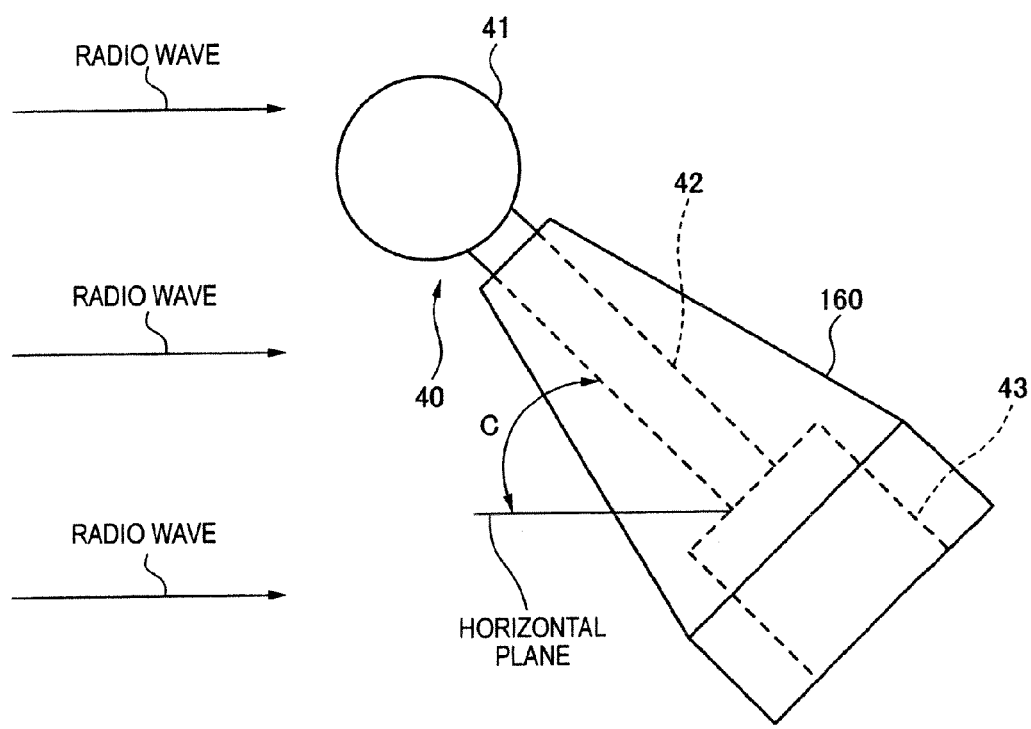
FIG. 17 is a block diagram showing a probe of a third example.
Figure 18:
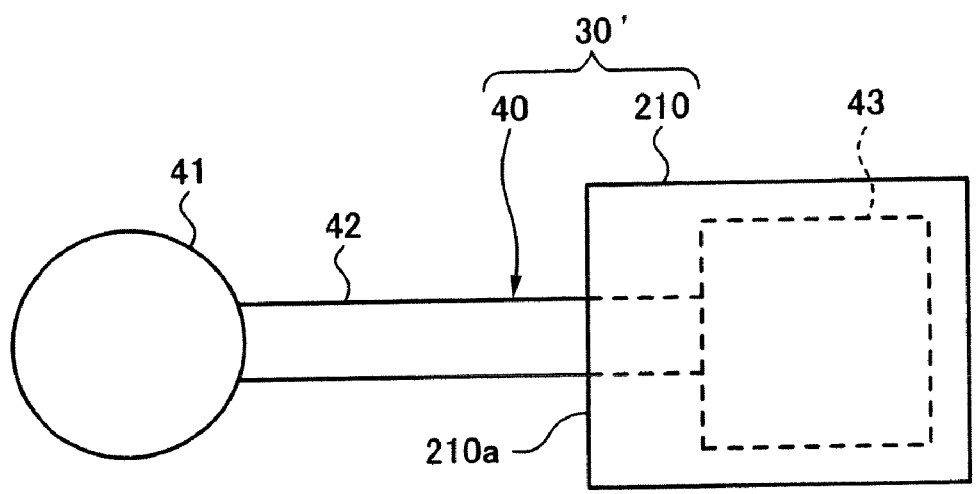
FIG. 18 is a block diagram showing a probe of a third comparative example.
Figure 19A:
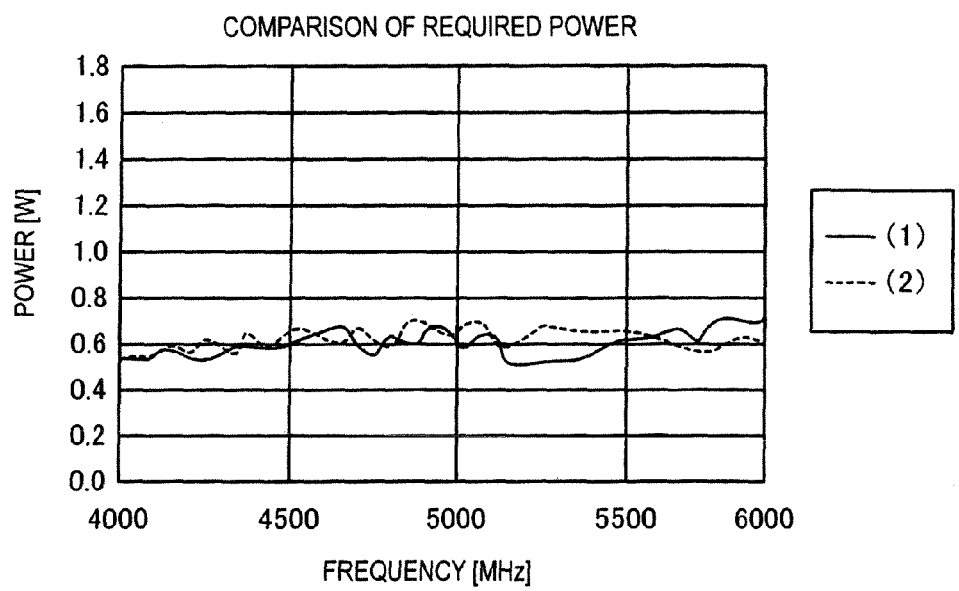
FIGS. 19A and 19B are graphs showing results of examples.
Figure 19B:
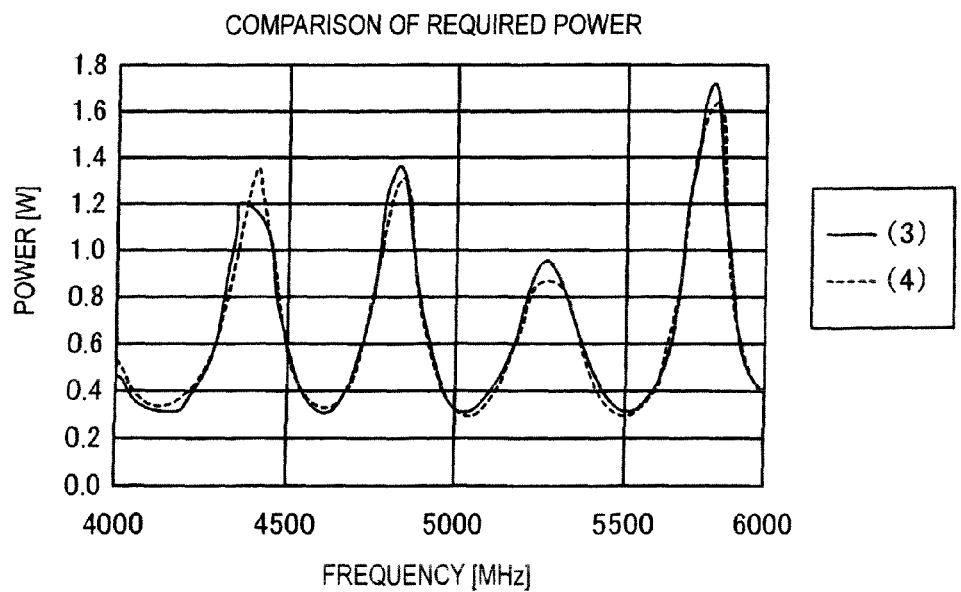
Figure 21:
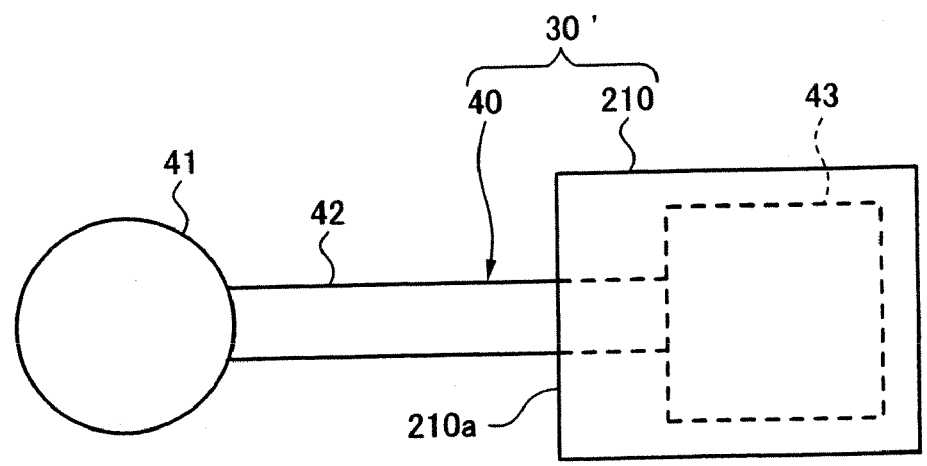
FIG. 21 is a block diagram showing a probe of a second comparative example.

FIGS. 15A and 15B are graphs showing test results, wherein the vertical axis represents required power (W) and the horizontal axis represents a frequency (MHz). FIG. 16 is a graph showing variations computed from the test results. As shown in FIGS. 15A, 15B and 16, tests were conducted in six modes while conditions were changed. FIG. 17 is a block diagram showing the arrangement of the probe main body 40 of a third example. FIG. 18 is a block diagram showing a probe 30' of a third comparative example.

First Example

In a first example, the radio wave absorber 160 of the embodiment (see FIGS. 10A and 10B) was attached to the probe main body 40, to thus constitute the probe 30. The test was conducted while the probe 30 was fastened to the upstand 31. In this case, the pipe section 42 of the probe main body 40 was fastened so as to become horizontal with respect to the antenna 20 (see FIG. 1). The upstand 31 (see FIG. 1) was formed from FRP (Fiber-Reinforced Plastics). A radio wave absorber, which was formed from the same material as that of the radio wave absorber 160, was attached to the upstand 31. The diameter A (shown in FIG. 10A) of the head section 41 of the probe main body 40 is set to 10 cm, and a segment B (shown in FIG. 10A) by way of which the pipe section 42 was exposed from the radio wave absorber 160 is set to 1 cm.

Under the conditions of the first example, the test results such as those indicated by line (1) in FIG. 15A were obtained. As shown in FIG. 16, the range of changes is 1.7 dB. As mentioned above, in the first example, fluctuations in the required power attributable to the frequency are considerably small.

Second Example

In a second example, the radio wave absorber 160 (see FIGS. 10A and 10B) of the present example was attached to the probe main body 40, to thus form the probe 30. The test was carried out by attaching the probe 30 to an unillustrated polystyrene foam mount. In this case, the pipe section 42 of the probe main body 40 was attached to the antenna 20 (see FIG. 1) so as to become horizontal to the same. Box-shaped polystyrene foam was used in an inclined form as an unillustrated polystyrene foam mount. Specifically, the unillustrated polystyrene foam was inclined, thereby arranging the probe main body 40 so as to become horizontal to the antenna 20.

Under conditions of the second example, test results such as those indicated by line (2) in FIG. 15A were acquired. As shown in FIG. 16, the range of variations was 1.6 dB. As mentioned above, even in the case of the second example, fluctuations in the required power attributable to a frequency were considerably small.

Third Example

In a third example, the radio wave absorber 160 (see FIGS. 10A and 10B) of the present example was attached to the probe main body 40, to thus constitute the probe 30. The test was carried out by attaching the probe 30 to the unillustrated polystyrene foam mount. In this case, as shown in FIG. 17, the probe main body 40 was inclined at a horizontal angle C of 45 degrees with respect to the antenna 20 (see FIG. 1). Specifically, the probe main body 40 forms an inclination of 45 degrees with respect to the direction of a radio wave from the antenna 20.

Under the conditions of the third example, test results such as those indicated by line (3) shown in FIG. 15A were obtained. In this case, as shown in FIG. 16, the range of variations was 1.3 dB. Even in the case of the third example, fluctuations in required power attributable to a frequency were considerably small.

First Comparative Example

A test was conducted, as a first comparative example, by attaching the probe main body 40 to the unillustrated polystyrene foam mount at a horizontal angle of 33.5 degrees and a vertical angle of 33.5 degrees without attachment of the radio wave absorber. A test result, such as that indicated by line (4) in FIG. 15B, was obtained as a result of the first comparative example. As shown in FIG. 16, the range of variations was 2.2 dB.

Second Comparative Example

A test was conducted, as a second comparative example, by attaching the probe main body 40 to the antenna 20 of an FRP-made mast without attachment of the radio wave absorber. In the second comparative example, as indicated by line (5) in FIG. 15B, fluctuations in the required power were great. As shown in FIG. 16, the range of changes was 7.0 dB.

Third Comparative Example

As shown in FIG. 18, as a third comparative example, a cubic radio wave absorber 210 was attached to the probe main body 40, to thus constitute a probe 30'. The probe 30' was fastened to the mast made of FRP. In the cubic radio wave absorber 210, a large wall section 210a was arranged on the head section 41 of the probe main body 40. The radio wave absorber 210 covered only the box section 43 of the pipe section 42 in the probe main body 40. Most of the pipe section 42 was exposed.

Even in the third comparative example, fluctuations in the required power were large, as indicated by line (6) in FIG. 15. As shown in FIG. 16, the range of variations was 7.0 dB. Even in this case, the probe 30' shown in FIG. 18 is fastened so as to become horizontal to the antenna 20 (see FIG. 1).

As mentioned above, in the first to third examples, the ranges of variations in the required power were smaller than those acquired in the first through third comparative examples, and frequency dependence was small. For instance, in the second and third comparative examples, the maximum required power and the minimum required power changed by a factor of five or thereabouts. Therefore, a piece of equipment meeting the maximum required power, such as a power amplifier, is required, and larger power consumption is required. For these reasons, difficulty is encountered in curtailing manufacturing cost and test cost. In contrast, in the case of the first through third examples, a difference between the maximum required power and the minimum required power is small, and hence a piece of equipment, such as a power amplifier having a low rating output, is sufficient. For these reasons, manufacturing cost and test cost can be significantly curtailed.

It can be said that the larger the variations in transmission output attributable to a frequency, the greater the influence of a wave reflected from a structure including the probe 30. Therefore, in the first through third examples involving small variations, the influence of the variations can be diminished.

Moreover, according to the results of the first through third comparative examples, variations in power can be said to become extremely large when the probe 30 is arranged horizontally. When the main body section of the probe 30 is covered with a radio wave absorber of the present embodiment, variations in power are reduced. Hence, the variations are considered to be attributable to the influence of the wave reflected from the main body section.

As described with reference to the embodiment, occurrence of an error in measurement of an electromagnetic field probe may be prevented by suppressing occurrence of a phenomenon of reflection of an electromagnetic wave.

Although the present invention has been shown and described with reference to the embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. An exterior body used in an electromagnetic field probe having a radio wave reflector extending from an antenna section to a box section, the exterior body comprising:
    a radio wave absorber;
    a housing section that is provided in the radio wave absorber and houses the radio wave reflector and the box section of the electromagnetic field probe;
    an antenna side edge section located at a portion of the radio wave absorber facing the antenna section of the electromagnetic field probe; and
    a box side edge section located at a portion of the radio wave absorber facing the box section of the electromagnetic field probe,
    wherein the radio wave absorber has outer dimension and thickness that increases in accordance with an increase in distance from the antenna side edge section toward the box side edge section.

2. The exterior body according to claim 1, further comprising a retaining section that surrounds a circumference of the radio wave absorber and retains the radio wave absorber.

3. The exterior body according to claim 2, wherein the retaining section is a polystyrene foam.

4. The exterior body according to claim 2, wherein the retaining section includes:
    a first retaining section; and
    a second retaining section that engages with the first retaining section,
    wherein the first retaining section and the second retaining section surround the circumference of the radio wave absorber.

5. The exterior body according to claim 4, further comprising a boss provided on the first retaining section,
    wherein the second retaining section defines a hole section that engages with the boss of the first retaining section.

6. The exterior body according to claim 1, further comprising a posture defining member that defines a posture of the electromagnetic field probe upon contact with an exterior surface of the radio wave absorber.

7. An exterior body used in an electromagnetic field probe having a radio wave reflector extending from an antenna section to a box section, the exterior body comprising:
- a first exterior section that forms a part of the exterior body; and
- a second exterior section that forms a part of the exterior body and engages with the first exterior section in a splitable manner;
- wherein each of the first exterior section and the second exterior section has:
- a radio wave absorber that covers the radio wave reflector of the electromagnetic field probe; and
- a radio wave transmission body that is provided on an exterior surface of the radio wave absorber,
- wherein the radio wave absorber includes:
- an antenna side edge section located at a portion of the radio wave absorber facing the antenna section of the electromagnetic field probe; and
- a box side edge section located at a portion of the radio wave absorber facing the box section of the electromagnetic field probe,
- wherein the exterior body has outer dimension and thickness that increases in accordance with an increase in distance from the antenna side edge section toward the box side edge section.

8. The exterior body according to claim 7, wherein the radio wave absorber and the radio wave transmission body, both of which belong to the first exterior section, are coupled into a piece; and
- wherein the radio wave absorber and the radio wave transmission body, both of which belong to the second exterior section, are coupled into a piece.

9. An exterior body used in an electromagnetic field probe having a radio wave reflector extending from an antenna section to a box section, the exterior body comprising:
- a radio wave absorber;
- a housing section that is provided in the radio wave absorber and houses the radio wave reflector and the box section of the electromagnetic field probe;
- an antenna side edge section located at a portion of the radio wave absorber facing the antenna section of the electromagnetic field probe; and
- a box side edge section located at a portion of the radio wave absorber facing the box section of the electromagnetic field probe,
- wherein a cross-sectional area of part of the radio wave absorber increases in accordance with a distance from the antenna side edge section toward the box side edge section, and
- wherein the cross-sectional area is configured to be maximum at an intermediate section between the antenna side edge section and the box side edge section or at the position of the box side edge section.

10. The exterior body according to claim 9, further comprising a retaining section that surrounds a circumference of the radio wave absorber and retains the radio wave absorber.

11. The exterior body according to claim 10, wherein the retaining section is formed from polystyrene foam.

12. The exterior body according to claim 10, wherein the retaining section includes:
- a first retaining section; and
- a second retaining section that engages with the first retaining section,
- wherein the first and second retaining sections surround the circumference of the radio wave absorber.

13. The exterior body according to claim 12, further comprising a boss provided on the first retaining section,
- wherein the second retaining section defines a hole section that engages with the boss of the first retaining section.

14. The exterior body according to claim 9, further comprising a posture defining member that defines a posture of the electromagnetic field probe upon contact with an exterior surface of the radio wave absorber.

15. An exterior body used in an electromagnetic field probe having a radio wave reflector extending from an antenna section to a box section, the exterior body comprising:
- a first exterior section that forms a part of the exterior body; and
- a second exterior section that forms a part of the exterior body and engages with the first exterior section in a splitable manner;
- wherein each of the first exterior section and the second exterior section has:
- a radio wave absorber that covers the radio wave reflector of the electromagnetic field probe; and
- a radio wave transmission body that is provided on an exterior surface of the radio wave absorber,
- wherein the radio wave absorber has a proximal end section provided close to the antenna section of the electromagnetic field probe and a distal end section provided remote from the antenna section,
- wherein part of the radio wave absorber has a cross-sectional area that increases in accordance with a distance from the proximal end section toward the distal end section, and
- wherein the cross-sectional area is configured to be maximum at an intermediate section between the proximal end section and the distal end section or at the position of the distal end section.

16. The exterior body according to claim 15, wherein the radio wave absorber and the radio wave transmission body, both of which belong to the first exterior section, are coupled into a piece; and
- wherein the radio wave absorber and the radio wave transmission body, both of which belong to the second exterior section, are coupled into a piece.

* * * * *